(12) United States Patent
Yuan et al.

(10) Patent No.: US 12,472,385 B2
(45) Date of Patent: Nov. 18, 2025

(54) HIGH-INTENSITY FOCUSED ULTRASONIC DEVICE AND CONTROL METHOD

(71) Applicant: ULTRASOUND ASSISTED MEDTECH PTE. LTD., Guangdong (CN)

(72) Inventors: Jinqiang Yuan, Guangdong (CN); Kena Zhao, Guangdong (CN); Jiawei Mao, Guangdong (CN); Wenhai Liu, Guangdong (CN); Jia Zhou, Guangdong (CN); Zuping Jiang, Guangdong (CN)

(73) Assignee: ULTRASOUND ASSISTED MEDTECH PTE. LTD., Guangdong (CN)

( * ) Notice: Subject to any disclaimer, the term of this patent is extended or adjusted under 35 U.S.C. 154(b) by 636 days.

(21) Appl. No.: 17/758,545

(22) PCT Filed: Dec. 31, 2020

(86) PCT No.: PCT/CN2020/142369
§ 371 (c)(1),
(2) Date: Jul. 8, 2022

(87) PCT Pub. No.: WO2021/139602
PCT Pub. Date: Jul. 15, 2021

(65) Prior Publication Data
US 2023/0061243 A1    Mar. 2, 2023

(30) Foreign Application Priority Data
Jan. 10, 2020 (CN) .......................... 202010026121.9

(51) Int. Cl.
*A61B 8/00* (2006.01)
*A61B 34/20* (2016.01)
(Continued)

(52) U.S. Cl.
CPC ................ *A61N 7/00* (2013.01); *A61B 34/20* (2016.02); *G01S 15/8936* (2013.01);
(Continued)

(58) Field of Classification Search
CPC .............. A61B 8/4218; G01S 15/8936; A61N 2007/0052; A61N 7/00
See application file for complete search history.

(56) References Cited

U.S. PATENT DOCUMENTS

| 5,562,096 A | 10/1996 | Hossack et al. |
| 2006/0293598 A1* | 12/2006 | Fraser .................... A61N 7/02 |
| | | 600/439 |

(Continued)

FOREIGN PATENT DOCUMENTS

| CN | 1364649 A | 8/2002 |
| CN | 101427912 A | 5/2009 |

(Continued)

OTHER PUBLICATIONS

First Chinese Office Action issued on Jul. 30, 2024 for Chinese Patent Application No. 202010026121.9 (16 pages).

(Continued)

*Primary Examiner* — Rajeev P Siripurapu
(74) *Attorney, Agent, or Firm* — Fox Rothschild LLP

(57) ABSTRACT

According to a high-intensity focused ultrasonic apparatus and a control method, an image of a region to be treated is obtained by means of an imaging device, a working assembly and a target coordinate point in the region to be treated are located by means of an optical tracking device, so that a positioning device can clamp the working assembly to quickly and accurately move to a working position corresponding to the target coordinate point, thereby enabling the working assembly to quickly and accurately release a high-intensity focused ultrasonic pulse to the target coordinate (Continued)

point, which improves not only the treatment accuracy but also the treatment efficiency of the high-intensity focused ultrasonic apparatus.

20 Claims, 8 Drawing Sheets

(51) Int. Cl.
*A61N 7/00* (2006.01)
*G01S 15/89* (2006.01)
*A61B 34/10* (2016.01)
*A61B 90/00* (2016.01)

(52) U.S. Cl.
CPC . *A61B 2034/105* (2016.02); *A61B 2034/2055* (2016.02); *A61B 2090/3937* (2016.02); *A61N 2007/0052* (2013.01)

(56) References Cited

U.S. PATENT DOCUMENTS

| | | | |
|---|---|---|---|
| 2008/0064960 A1* | 3/2008 | Whitmore, III | A61N 7/02 600/459 |
| 2010/0081893 A1 | 4/2010 | Jarvik et al. | |
| 2011/0166450 A1 | 7/2011 | Peyrard et al. | |
| 2012/0215108 A1 | 8/2012 | Park et al. | |
| 2013/0331685 A1 | 12/2013 | Liu et al. | |
| 2015/0165243 A1 | 6/2015 | Slayton et al. | |
| 2015/0297177 A1* | 10/2015 | Boctor | A61B 34/30 901/47 |
| 2015/0341542 A1 | 11/2015 | Preston | |
| 2017/0246482 A1 | 8/2017 | Hananel et al. | |
| 2020/0000428 A1* | 1/2020 | Kim | A61B 8/4209 |

FOREIGN PATENT DOCUMENTS

| | | |
|---|---|---|
| CN | 102525596 A | 7/2012 |
| CN | 103143125 A | 6/2013 |
| CN | 103479403 A | 1/2014 |
| CN | 104815399 A | 8/2015 |
| CN | 106890025 A | 6/2017 |
| CN | 107320180 A | 11/2017 |
| CN | 108290053 A | 7/2018 |
| CN | 108904038 A | 11/2018 |
| CN | 109688934 A | 4/2019 |
| CN | 110200655 A | 9/2019 |
| CN | 110464456 A | 11/2019 |
| CN | 111134776 A | 5/2020 |
| CN | 211911724 U | 11/2020 |
| EP | 2340781 A1 | 7/2011 |
| EP | 3453343 A1 | 3/2019 |
| WO | 2017182655 A1 | 10/2017 |

OTHER PUBLICATIONS

European Search Report issued on Nov. 29, 2023 for European Patent Application No. 20912118.5 (10 pages).
International Search Report and Written Opinion for International Application No. PCT/CN2020/142369, filed Dec. 31, 2020, mailed Mar. 19, 2021.
Second Chinese Office Action issued on Mar. 1, 2025 for Chinese Patent Application No. 202010026121.9 (4 pages).
Chinese Supplementary Search Report issued on Feb. 26, 2025 for Chinese Patent Application No. 202010026121.9 (2 pages).
Chinese Notice of Granting Invention Patent Right issued on Jun. 30, 2025 for Chinese Patent Application No. 202010026121.9 (4 pages).

* cited by examiner

HIGH-INTENSITY FOCUSED ULTRASONIC DEVICE AND CONTROL METHOD

CROSS-REFERENCE TO RELATED APPLICATIONS

This is a national stage application filed under 37 U.S.C. 371 based on International Patent Application No. PCT/CN2020/142369, filed on Dec. 31, 2020, which claims priority to Chinese Patent Application No. 202010026121.9, filed on Jan. 10, 2020, the disclosures of which are incorporated herein by reference in their entireties.

FIELD

This application relates to the field of high-intensity focused ultrasonic technology, and in particular, to a high-intensity focused ultrasonic apparatus and a control method.

BACKGROUND

Histotripsy and lithotripsy are non-invasive tissue ablation modalities that focus, from outside the body, pulsed ultrasound onto target tissue in vivo. Histotripsy mechanically damages tissue through cavitation micro-bubbles, and the cavitation micro-bubbles homogenize cellular tissue into a cell-free fluid that can be excreted or absorbed by the body. Sound waves are usually used to break up urinary stones in lithotripsy.

As part of a surgical operation or other therapeutic procedures, histotripsy has the target tissue volume or tissue contents cavitated by high-intensity focused ultrasound, thereby mechanically destroying the target tissue. Histotripsy is most effective in a case where the whole acoustic and energy converter scan parameters within the space to be periodically cavitated are controlled within a fairly narrow range. Minor changes in any parameter can cause an ongoing process to be interrupted.

Histotripsy requires high peak acoustic pulses, which means that a large surface area is required to focus the energy converter. Typically, these energy converters are very similar to those used in lithotripsy, and operate in the same frequency range.

In the process of histotripsy, diagnostic/imaging ultrasound can be used to visualize a surgical anatomy and monitor the process of the anatomy in real time. On diagnostic/imaging ultrasound, cavitation bubble clouds in the histotripsy can be very clearly shown as hyperechoic (bright) regions, while ablated homogenized tissue can be shown as a hypoechoic (dark) region. Large and irregular tissue volumes can be ablated through using histotripsy by means of electronically changing the focus of the treatment array or mechanically moving the focus of the treatment energy converter within a target region of the surgical operation.

The conventional high-intensity focused ultrasonic apparatus has an issue of being incapable of quickly and accurately locating a target coordinate point of a region to be treated, which significantly adversely affects the treatment accuracy and treatment efficiency of the high-intensity focused ultrasonic apparatus.

SUMMARY

In view of this, it is necessary to provide a high-intensity focused ultrasonic apparatus and a control method to address the issues in the conventional solution that the conventional high-intensity focused ultrasonic apparatus cannot quickly and accurately locate a target coordinate point of a region to be treated.

A high-intensity focused ultrasonic apparatus configured to perform high-intensity focused ultrasonic treatment on a region to be treated is provided according to the present application. The high-intensity focused ultrasonic apparatus includes: an imaging device, an optical tracking device, a working assembly and a positioning device.

The imaging device is configured to acquire an image of the region to be treated.

The optical tracking device includes a camera, and multiple optical markers arranged on the region to be treated or the imaging device for realizing locating of any point in the region to be treated.

The working assembly is configured to release a high-intensity focused ultrasonic pulse to irradiate the target coordinate point after the target coordinate point in the region to be treated is determined.

The positioning device has one end fixedly arranged, and another end configured to be capable of clamping the working assembly and extending to move freely, and the positioning device is configured to clamp the working assembly to move to a working position corresponding to the target coordinate point to allow the working assembly to irradiate the target coordinate point.

Multiple optical markers are further arranged on the working assembly or the positioning device for realizing locating of the working assembly.

A control method for a high-intensity focused ultrasonic apparatus is provided according to the present application, the control method is applicable to the high-intensity focused ultrasonic apparatus mentioned in the foregoing content. The control method for a high-intensity focused ultrasonic apparatus includes the steps as follows.

At a first moment, a first image of a region to be treated is acquired, modelling analysis is performed on the first image, and a 3D model of the region to be treated is generated. The first image is acquired by a medical imaging apparatus.

At a second moment, a second image of the region to be treated is acquired; the second image is acquired by an imaging device in the high-intensity focused ultrasonic apparatus. The first moment is earlier than the second moment.

The first image and the second image are fused, and a fused 3D model image of the region to be treated is generated, and an optical tracking device is controlled to locate the fused 3D model image.

After a target coordinate point in the fused 3D model image is selected, and according to the multiple optical markers arranged on the working assembly or on the positioning device, a coordinate location of the working assembly or the positioning device is acquired.

A coordinate location of the target coordinate point is acquired, and according to the coordinate location of the target coordinate point and the coordinate location of the working assembly or the positioning device, the positioning device is controlled to clamp the working assembly and to move to a working position corresponding to the target coordinate point, to allow the working assembly to release a high-intensity focused ultrasonic pulse to irradiate the target coordinate point.

The imaging device acquires the image of the region to be treated in real time, so as to monitor the irradiation process in which the working assembly irradiates the target coordinate point.

The present application relates to the high-intensity focused ultrasonic apparatus and the control method, in which an image of a region to be treated is acquired by the imaging device, the working assembly, and the target coordinate point in the region to be treated are located by the optical tracking device, so that the positioning device can clamp the working assembly and move quickly and accurately to the working position corresponding to the target coordinate point, to allow the working assembly to quickly and accurately release high-intensity focused ultrasonic pulses to the target coordinate point, which significantly improves not only the treatment accuracy of the high-intensity focused ultrasonic apparatus but also the treatment efficiency of the high-intensity focused ultrasonic apparatus.

REFERENCE LIST

Figure 1:
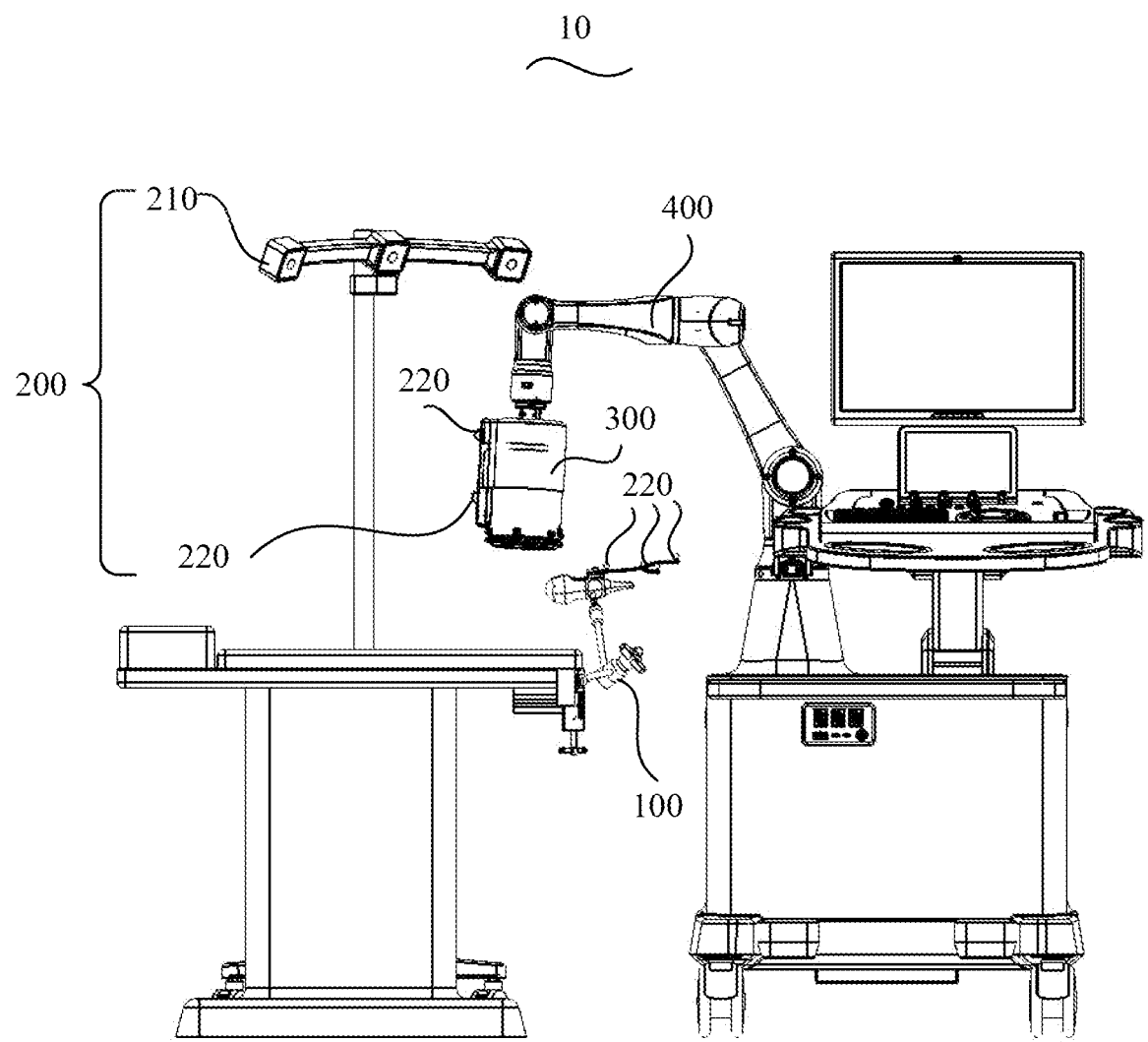
FIG. 1 is a schematic structural diagram of a high-intensity focused ultrasonic apparatus according to an embodiment of the present application.
Figure 2:
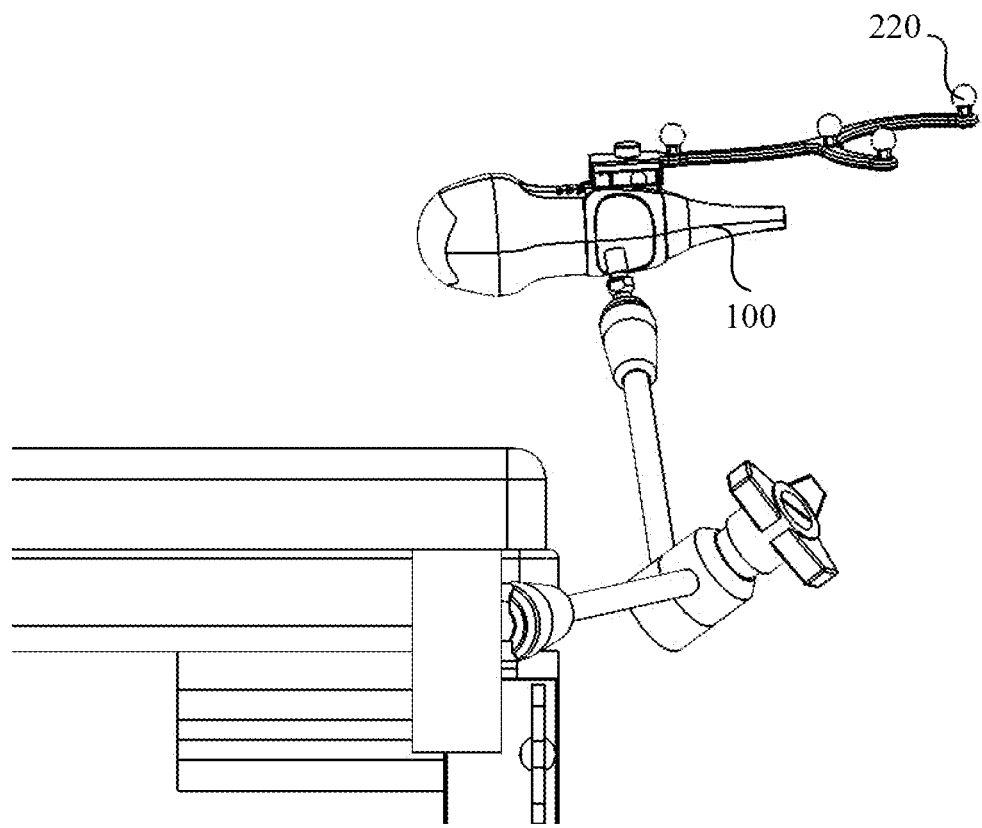
FIG. 2 is a schematic diagram showing the cooperation of an imaging device and an optical marker in a high-intensity focused ultrasonic apparatus according to an embodiment of the present application.

10 high-intensity focused ultrasonic apparatus
100 imaging device
110 casing
111 driving motor
120 front-end energy converter
200 optical tracking device
210 camera
220 optical marker
300 working assembly
310 first component
311 first engaging member
320 membrane
330 second component
340 high-intensity focused ultrasonic probe
341 first end face
342 second end face
343 through hole
350 working assembly main body
351 base plate
351*a* connecting hole
352 driving device
352*a* driving shaft
353 connecting rod
353*a* first connecting rod
353*b* second connecting rod
354 housing
360 second engaging member
370 slider
380 medium injection hole
391 first gear
392 second gear
400 positioning device

DETAILED DESCRIPTION

In order to make the aspects, technical solutions and advantages of the present application more clearly understood, the present application is described in further detail hereinafter with reference to the drawings and embodiments. It should be understood that the embodiments described herein are only intended to explain the present application rather than limiting the present application.

A high intensity focused ultrasonic apparatus 10 is provided according to the present application.

As shown in FIG. 1, in an embodiment of the present application, the high-intensity focused ultrasonic apparatus 10 includes an imaging device 100, an optical tracking device 200, a working assembly 300 and a positioning device 400. The optical tracking device 200 includes a camera 210 and multiple optical markers 220. The multiple optical markers 220 are arranged on a region to be treated or the imaging device 100, for realizing locating of any point in the region to be treated. Multiple optical markers 220 are further arranged on the working assembly 300 or the positioning device 400 for realizing locating of the working assembly 300. The positioning device 400 has one end fixedly arranged, and another end configured to be capable of clamping the working assembly 300 and extending to move freely.

The imaging device 100 is configured to acquire an image of a region to be treated. The working assembly 300 is configured to release a high-intensity focused ultrasonic pulse after a target coordinate point in the region to be treated is selected to irradiate the target coordinate point. The positioning device 400 is configured to clamp the working assembly 300 and to move to a working position corresponding to the target coordinate point, so that the working assembly 300 can irradiate the target coordinate point.

Specifically, the optical tracking device 200 includes a camera 210 and multiple optical markers 220. The camera 210 may be an optical camera. The optical markers 220 may be optical marker balls.

Multiple optical markers 220 may be arranged in a regular arrangement in the region to be treated. Multiple optical markers 220 may further be arranged on the imaging device 100. Multiple optical markers 220 may be arranged on any one of the region to be treated and the imaging device 100, for realizing locating of any point in the region to be treated.

In a case where the multiple optical markers 220 are arranged in the region to be treated, and the imaging device 100 acquires an image of the region to be treated, the image of the region to be treated includes locations of the multiple optical markers 220. The coordinate location of any point in the image of the region to be treated can be calculated according to the locations of the multiple optical markers 220 in the image of the region to be treated. For example, the number of the optical markers 220 may be three. Although there are only three optical markers 220, the coordinate location of any point in the image of the region to be treated can be calculated according to the mutual positional relationships of the three optical markers 220.

In a case where the multiple optical markers 220 are arranged on the imaging device 100, the imaging device 100 acquires an image of the region to be treated, and in this case, the camera 210 can track the location of the imaging device 100. The coordinate location of any point on the image acquired by the imaging device 100 may be calculated according to the location of the imaging device 100.

The multiple optical markers 220 may be arranged on the working assembly 300. The multiple optical markers 220 may be arranged on the positioning device 400. Multiple optical markers 220, regardless of multiple optical markers 220 arranged on the working assembly 300 or the positioning device 400, can realize locating of the working assembly 300.

In a case where the multiple optical markers 220 are arranged on the working assembly 300, the working assembly 300 can be located directly according to the locations of the multiple optical markers 220.

In a case where the multiple optical markers 220 are arranged on the positioning device 400, the working assembly 300 can be located according to the locations of the multiple optical markers 220, and the relative positional relationship between the positioning device 400 and the working assembly 300 (i.e., the distance between the positioning device 400 and the working assembly 300, which can be preset when the high-intensity focused ultrasonic apparatus 10 is designed).

One end of the positioning device 400 is fixedly arranged on any component or apparatus. For example, one end of the positioning device 400 may be fixedly arranged on a trolley. Another end of the positioning device 400 is configured to be capable of clamping the working assembly 300 and extending to move freely. The high-intensity focused ultrasonic apparatus 10 may further include a display device and a control device. The display device and the control device may be arranged on one trolley. The display device can display the real-time image acquired by the imaging device 100, so as to monitor the irradiation process of the working assembly. The display device can also display a fused 3D model image, and a user selects a target coordinate point on the fused 3D model image. The target coordinate point is one of any points in the region to be treated. After the target coordinate point is selected, the control device is used to control the positioning device 400 to clamp the working assembly 300, and move to a working position corresponding to the target coordinate point, so that the working assembly 300 releases a high-intensity focused ultrasonic pulse to irradiate the target coordinate point.

In this embodiment, an image of the region to be treated is acquired by the imaging device 100, and the working assembly 300, and the target coordinate point in the region to be treated are located by the optical tracking device 200, so that the positioning device 400 can clamp the working assembly 300 to quickly and accurately move to the working position corresponding to the target coordinate point, thus allowing the working assembly 300 to quickly and accurately release a high-intensity focused ultrasonic pulse to the target coordinate point, which not only greatly improves the treatment accuracy but also improves the treatment efficiency of the high-intensity focused ultrasonic apparatus 10.

In an embodiment of the present application, the imaging device 100 is an ultrasonic imaging probe.

Specifically, the imaging device 100 may be an ultrasonic imaging probe, and the ultrasonic imaging probe is configured to be rotatable to acquire images of the region to be treated at different angles.

In an embodiment of the present application, the positioning device 400 is a robotic arm.

Specifically, the positioning device 400 may be a robotic arm that is freely extendable.

In an embodiment of the present application, an energy focusing point at which the working assembly 300 releases a high-intensity focused ultrasonic pulse is located in an image scanning region of the imaging device 100.

Specifically, the imaging device 100 and the working assembly 300 may be integrally formed, or may be independently provided, but no matter how they are provided, the focusing point at which the working assembly 300 releases a high-intensity focused ultrasonic pulse is required to be positioned in the image scanning region of the imaging device 100.

In this embodiment, the energy focusing point, where the working assembly 300 releases the high-intensity focused ultrasonic pulse, is set to be located in the image scanning region of the imaging device 100, thereby, in the process that the working assembly 300 irradiates the target coordinate point, the imaging device 100 can acquire the image of the region to be treated in real time, so as to realize the purpose of monitoring.

Figure 3:
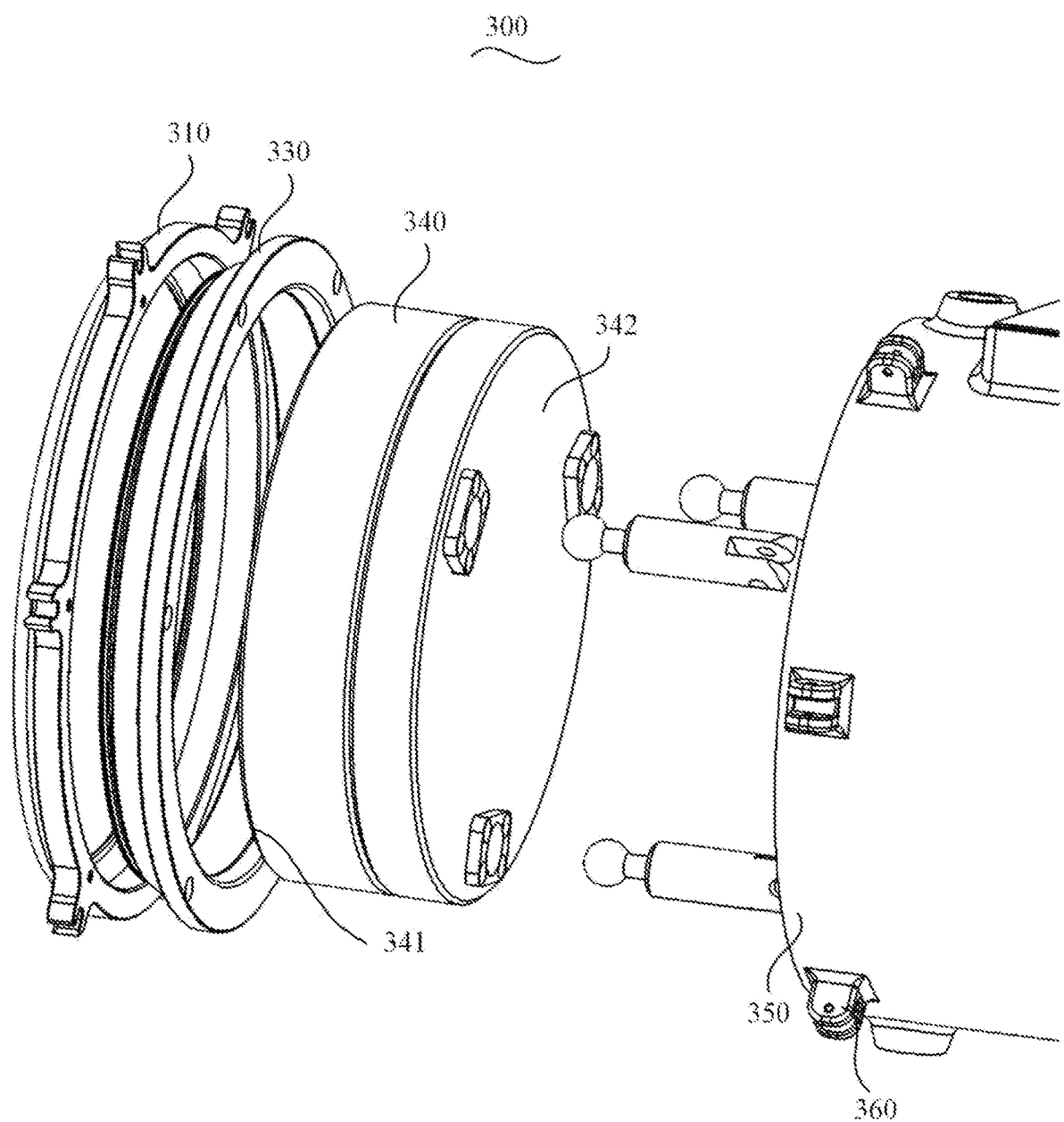
FIG. 3 is an exploded view of a working assembly in a high-intensity focused ultrasonic apparatus according to an embodiment of the present application.
Figure 4:
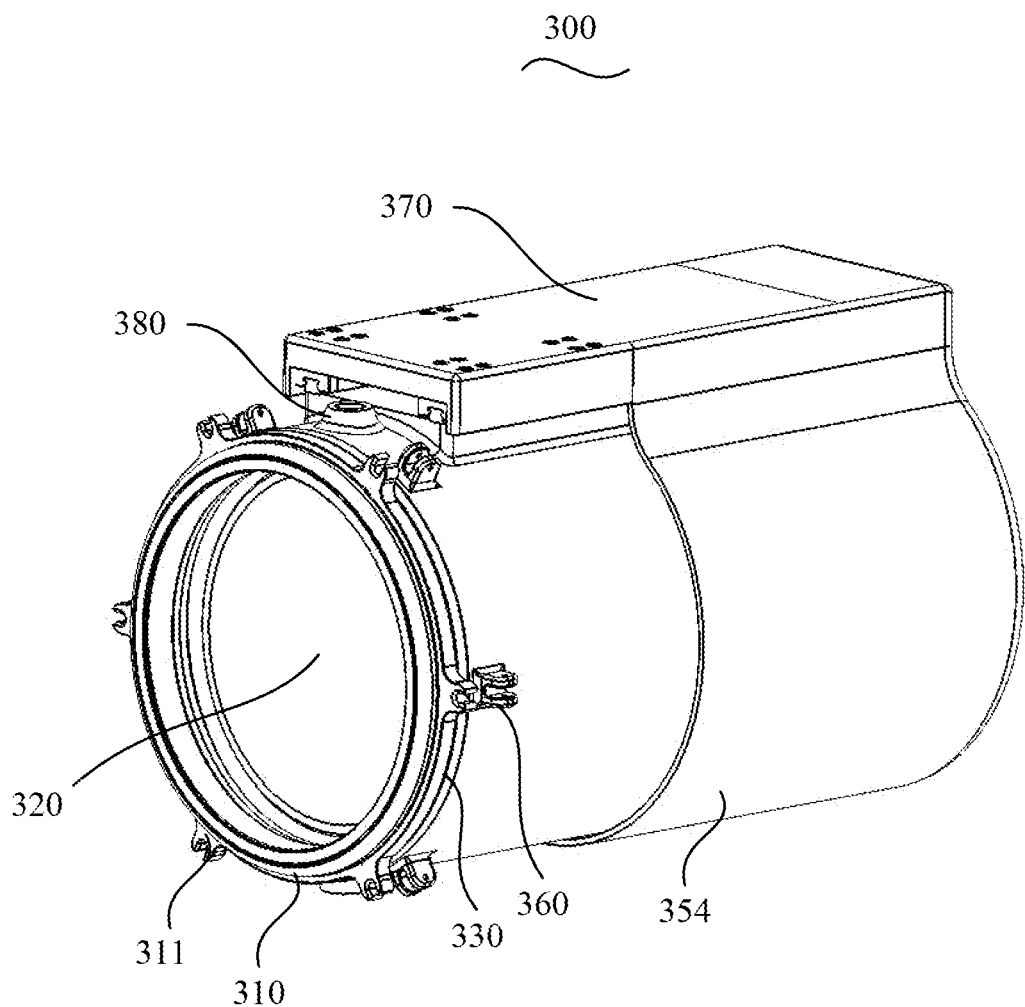
FIG. 4 is a schematic structural diagram of the working assembly in an assembled state in a high-intensity focused ultrasonic apparatus according to an embodiment of the present application.
Figure 5:
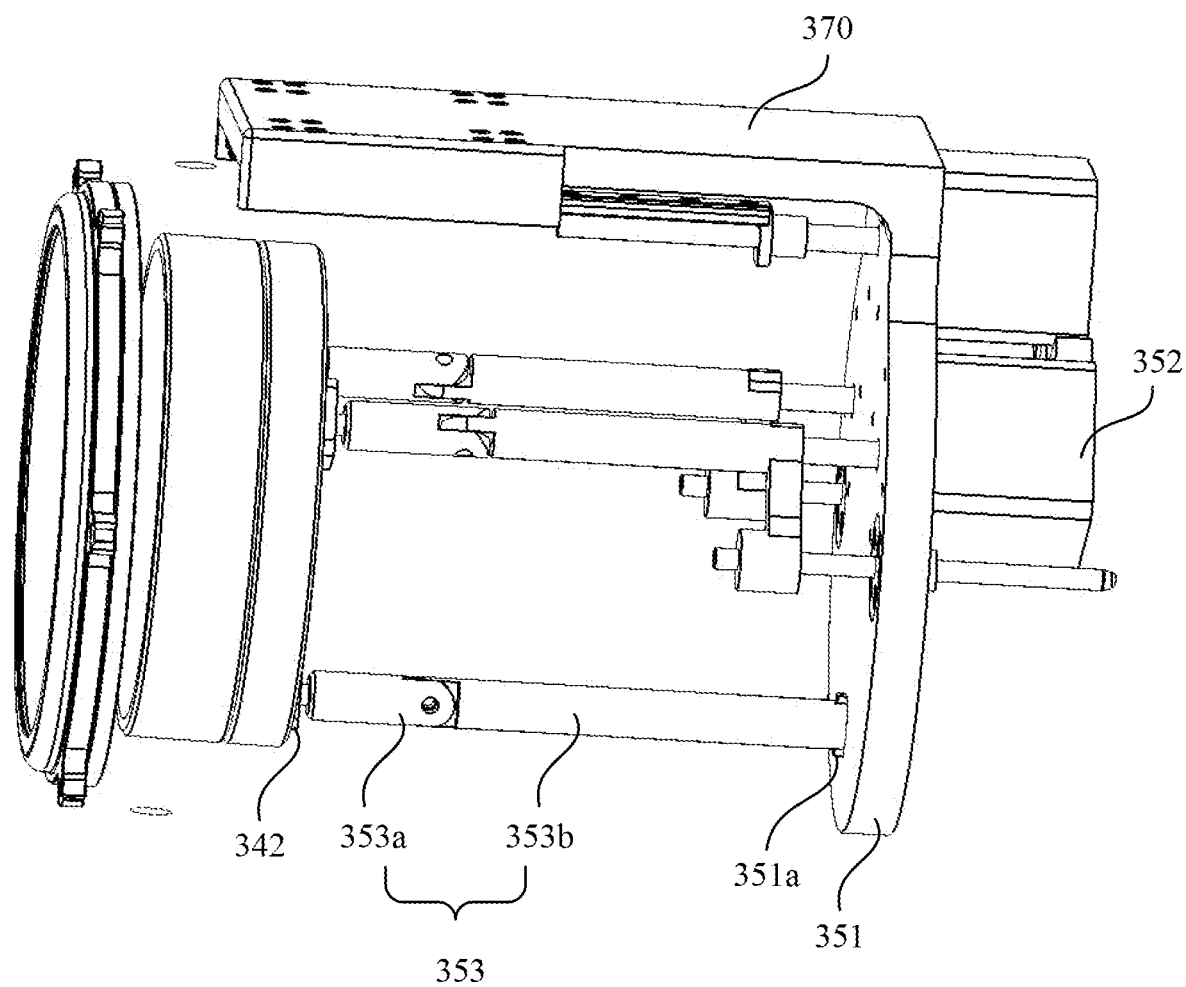
FIG. 5 is an exploded view of a working assembly in a high-intensity focused ultrasonic apparatus according to an embodiment of the present application.

As shown in FIG. 3, FIG. 4 and FIG. 5, in an embodiment of the present application, the working assembly 300 includes a first component 310, a membrane 320, a second component 330, a high-intensity focused ultrasonic probe 340 and a working assembly main body 350 that are arranged to be stacked sequentially.

The first component 310 is a hollow annular structure, and multiple first engaging members 311 are provided on an outer circumference of the first component 310. The second component 330 is a hollow annular structure. The membrane 320 is arranged between the first component 310 and the second component 330. The high-intensity focused ultrasonic probe 340 includes a first end face 341 and a second end face 342. The second end face 342 is fixedly/movably connected to the working assembly main body 350. An outer wall of the working assembly main body 350 is provided with second engaging members 360. The second engaging members 360 are arranged to be engageable with the first engaging members 311 respectively.

Specifically, the number of the first engaging members 311 can be set arbitrarily. Optionally, the first engaging members 311 may be arranged on the outer circumference of the first component 310 at equal intervals. The shape of the working assembly main body 350 may be a cylinder. The second engaging members 360 may also be arranged on the outer wall of the working assembly main body 350 at equal intervals, so as to be firmly cooperated with the first engaging members 311. The membrane 320 may have elasticity. When the working assembly 300 is in a use state, the working assembly 300 is filled with a liquid ultrasonic medium. After the first engaging members 311 and the second engaging members 360 are engaged respectively, the working assembly 300 is formed into an integral part, and the material of the membrane 320 is configured not to allow the ultrasonic medium to flow out of the working assembly 300. The membrane 320 is attached to the surface of the region to be treated, to allow the working assembly 300 to release a high-intensity focused ultrasonic pulse, to irradiate the target coordinate point through the ultrasonic medium, thus obtaining a better irradiation effect.

The second end face 342 may be fixedly connected to the working assembly main body 350. The second end face 342 may also be movably connected to the working assembly main body 350. The high-intensity focused ultrasonic probe 340, as an ultrasonic energy source, can release high-intensity focused ultrasonic pulses.

In this embodiment, the first component 310, the membrane 320, the second component 330, the high-intensity focused ultrasonic probe 340, and the working assembly main body 350 are sequentially stacked, such that the working assembly 300 formed by combining the above components can release high-intensity focused ultrasonic pulses to irradiate the target coordinate point.

Please continue to refer to FIG. 3, FIG. 4 and FIG. 5, in an embodiment of the present application, the working assembly main body 350 includes a base plate 351, a driving device 352, multiple connecting rods 353 and a housing 354. The base plate 351 is provided with multiple connecting holes 351a. The driving device 352 is fixedly connected to a surface of the base plate 351. One end of the connecting rod 353 passes through the connecting hole 351a to be electrically connected to the driving device 352. Another end of the connecting rod 353 is fixedly/movably connected to the second end face 342 of the high-intensity focused ultrasonic probe 340. The housing 354 covers the base plate 351, the driving device 352 and the multiple connecting rods 353. An outer surface of the housing 354 is provided with the multiple second engaging members 360.

Specifically, the shape of the working assembly 300 may be a cylinder, and the shape of the housing 354 may be hollow cylindrical, so as to realize covering the base plate 351, the driving device 352 and the multiple connecting rods 353. The driving device 352 may be a driving motor. The number of the connecting holes 351a is equal to the number of the connecting rods 353. The driving motor can be electrically connected to the connecting rod 353 through the connecting hole 351a to drive the connecting rod 353 to be bent and deformed or to move axially along a shaft of the driving motor, so as to realize the movable connection between the connecting rod 353 and the high-intensity focused ultrasonic probe 340.

In this embodiment, the driving device 352 and the multiple connecting rods 353 are provided, thereby the connecting rods 353 can be movably connected to the high-intensity focused ultrasonic probe 340, so that the high-intensity focused ultrasonic probe 340 can have position adjusted with respect to the base plate 351, and in the process of adjusting the position, the energy focusing point of the high-intensity focused ultrasonic probe 340 is adjusted, so that the energy focusing point can coincide with the target coordinate point of the region to be treated. The housing 354 is provided, thereby the base plate 351, the driving device 352 and the multiple connecting rods 353 can be covered, so that the above components can be protected from being damaged during operation.

In an embodiment of the present application, the driving device 352 is a driving motor.

Specifically, the driving motor may be an electric motor, and may also be a driving motor.

Please continue to refer to FIG. 3, FIG. 4 and FIG. 5, in an embodiment of the present application, each of the connecting rods 353 includes a first connecting rod 353a and a second connecting rod 353b. The first connecting rod 353a and the second connecting rod 353b are rotatably connected to each other. The first connecting rod 353a is rotatable relative to the second connecting rod 353b.

Specifically, the first connecting rod 353a and the second connecting rod 353b can be rotatably connected by a rotating pin. The first connecting rod 353a can be rotated relative to the second connecting rod 353b, which may be appreciated as being equivalent to that the position of the high-intensity focused ultrasonic probe 340 can have adjusted relative to the base plate 351, so as to realize adjustment of the energy focusing point of the high-intensity focused ultrasonic probe 340.

In this embodiment, the first connecting rod 353a and the second connecting rod 353b that are rotatably connected to each other are provided, thereby realizing position adjustment of the high-intensity focused ultrasonic probe 340 relative to the base plate 351, and further realizing the adjustment of the energy focusing point of the high-intensity focused ultrasonic probe 340, to allow the energy focusing point to coincide with the target coordinate point of the region to be treated.

In an embodiment of the present application, the driving device 352 includes multiple sub-driving devices. The number of the sub-driving devices is less than or equal to the number of the connecting rods 353. Each of the drive sub-devices is electrically connected to one connecting rod 353.

Specifically, the driving device 352 may be a driving motor. In this embodiment, the driving device 352 may also be multiple driving motors (i.e., sub-driving devices). The number of the sub-driving devices is less than or equal to the number of the connecting rods 353.

In a case where the number of the sub-driving devices is equal to the number of the connecting rods 353, the sub-driving devices are electrically connected to the connecting rods 353 in one-to-one correspondence to drive the first connecting rod 353a to rotate relative to the second connecting rod 353b in each of the different connecting rods 353.

In a case where the number of the sub-driving devices is smaller than the number of the connecting rods 353, there are one or more connecting rods 353 that are not electrically connected to any of the sub-driving devices. In this case, the one or more connecting rods 353 electrically connected to the one or more sub-driving devices can be driven to drive the connecting rod 353 that is not electrically connected to any of the sub-driving devices to rotate, thereby reducing the number of the sub-driving devices and saving costs.

In this embodiment, the driving device 352 are provided to include multiple sub-driving devices, and each of the sub-driving devices is electrically connected to one connecting rod 353, it is possible to drive the first connecting rod 353a to rotate relative to the second connecting rod 353b in each of the different connecting rods 353, and the control is more flexible.

Please continue to refer to FIG. 3, FIG. 4 and FIG. 5, in an embodiment of the present application, the working assembly 300 further includes a slider 370 and a medium injection hole 380. The slider 370 is arranged on the outer surface of the housing 354. One end of the positioning device 400 is slidably connected to the working assembly main body 350 through the slider 370. The slider 370 enables the working assembly 300 to slide freely relative to the positioning device 400 when the positioning device 400 clamps the working assembly 300. The medium injection hole 380 is provided on the outer surface of the housing 354.

Specifically, the medium injection hole 380 is a through hole for injecting a liquid ultrasonic medium. The slider 370 may be a sliding rail.

In this embodiment, the control device controls the positioning device 400 to freely extend and move to an appropriate position. The slider 370 is provided, thereby, the working assembly 300 can slide relative to the positioning device 400 to better fit against the surface of the region to be treated, the slider plays a role of assisting the positioning device 400 in positioning, thus, the positioning accuracy is higher, and the positioning speed is higher. The slider 370 can also eliminate the air gap in the ultrasonic irradiation path and improve the irradiation effect.

In an embodiment of the present application, the imaging device 100 and the working assembly 300 are integrally formed.

Specifically, the imaging device 100 may be manufactured integrally with the working assembly 300.

In this embodiment, the imaging device 100 and the working assembly 300 are integrally formed, thereby; the imaging device 100 can move synchronously with the working assembly 300, and the working efficiency is higher and the control is convenient.

Figure 6:
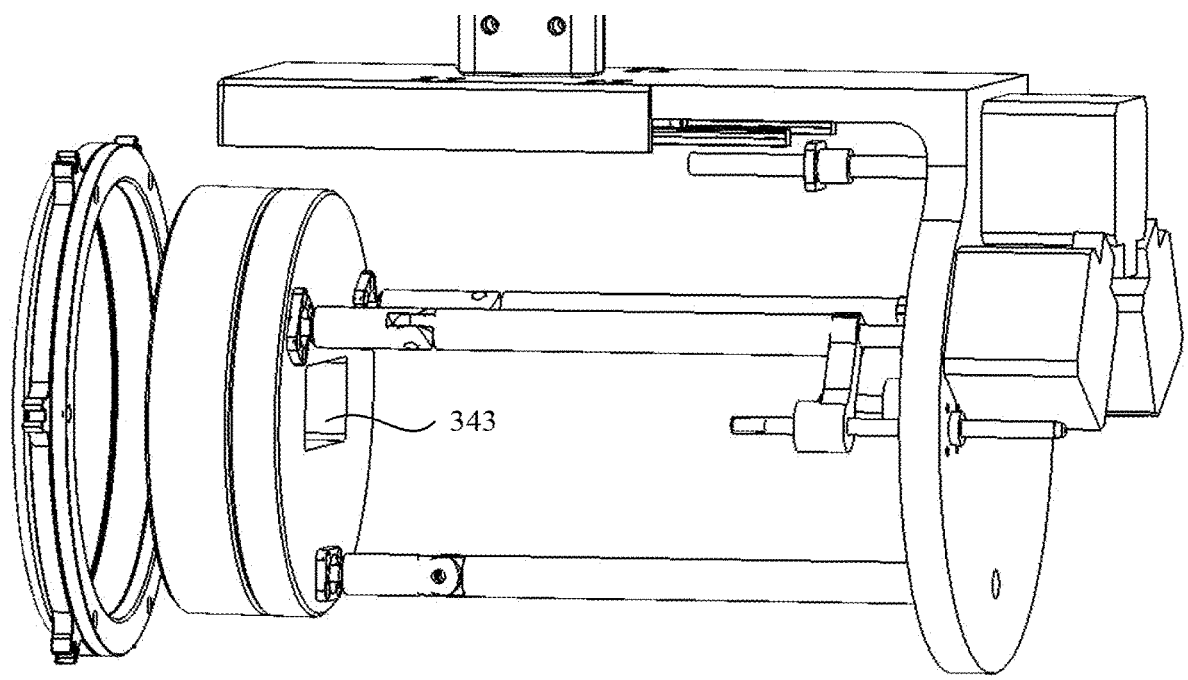
FIG. 6 is an exploded view of a working assembly in a high-intensity focused ultrasonic apparatus according to an embodiment of the present application.

As shown in FIG. 6, in an embodiment of the present application, the high-intensity focused ultrasonic probe 340 is provided with a through hole 343. The imaging device 100 passes through the through hole 343 to be rotatably/fixedly connected to the high-intensity focused ultrasonic probe 340.

Specifically, following the above embodiment, the imaging device 100 is integrally formed with the working assembly 300. In this embodiment, the high-intensity focused ultrasonic probe 340 is provided with the through hole 343, and the imaging device 100 is provided to pass through the through hole 343, thereby realizing that the imaging device 100 is integrally formed with the working assembly 300. The size of the through hole 343 is matched with the size of the high-intensity focused ultrasonic probe 340 to allow the imaging device 100 to pass through the through hole 343.

In this embodiment, the through hole 343 in the high-intensity focused ultrasonic probe 340 is provided, so that the imaging device 100 and the working assembly 300 can be integrally formed. The imaging device 100 is arranged to be rotatably connected to the high-intensity focused ultrasonic probe 340, thereby, the imaging device 100 can be freely rotated in the through hole 343, and the acquisition angle and range are greatly improved.

Figure 7:
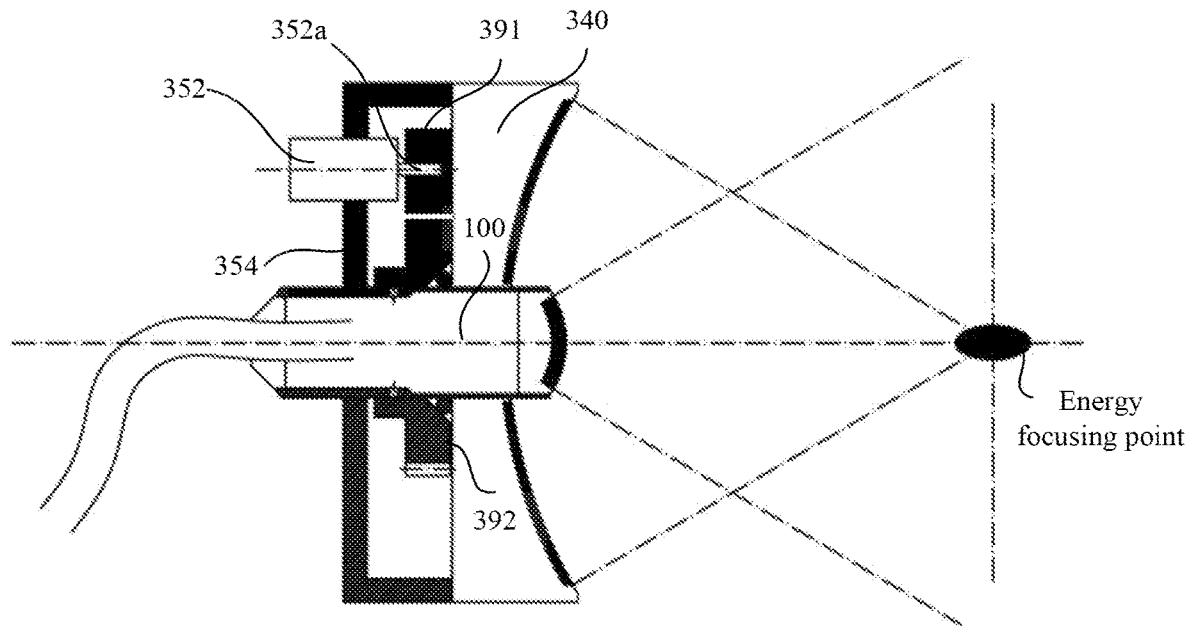
FIG. 7 is a schematic structural diagram of a high-intensity focused ultrasonic apparatus according to an embodiment of the present application.

As shown in FIG. 7, in an embodiment of the present application, the working assembly 300 further includes a first gear 391 and a second gear 392. The first gear 391 is sleeved on the driving shaft 352a of the driving device 352. The second gear 392 is sleeved on the imaging device 100. The first gear 391 and the second gear 392 mesh with each other.

This embodiment pertains to an embodiment in which the imaging device 100 is rotatably connected to the high-intensity focused ultrasonic probe 340. Specifically, in the process of using, the driving device 352 drives the driving shaft 352a to rotate, and the first gear 391 rotates accordingly. The first gear 391 and the second gear 392 mesh with each other, so that the rotation of the first gear 391 can drive the second gear 392 to rotate. The rotation of the second gear 392 can in turn drive the imaging device 100 to rotate.

In this embodiment, the first gear 391 and the second gear 392 that mesh with each other are provided, so that the imaging device 100 can be rotatably connected to the high-intensity focused ultrasonic probe 340, the implementation is simple and the cost is low.

Figure 8:
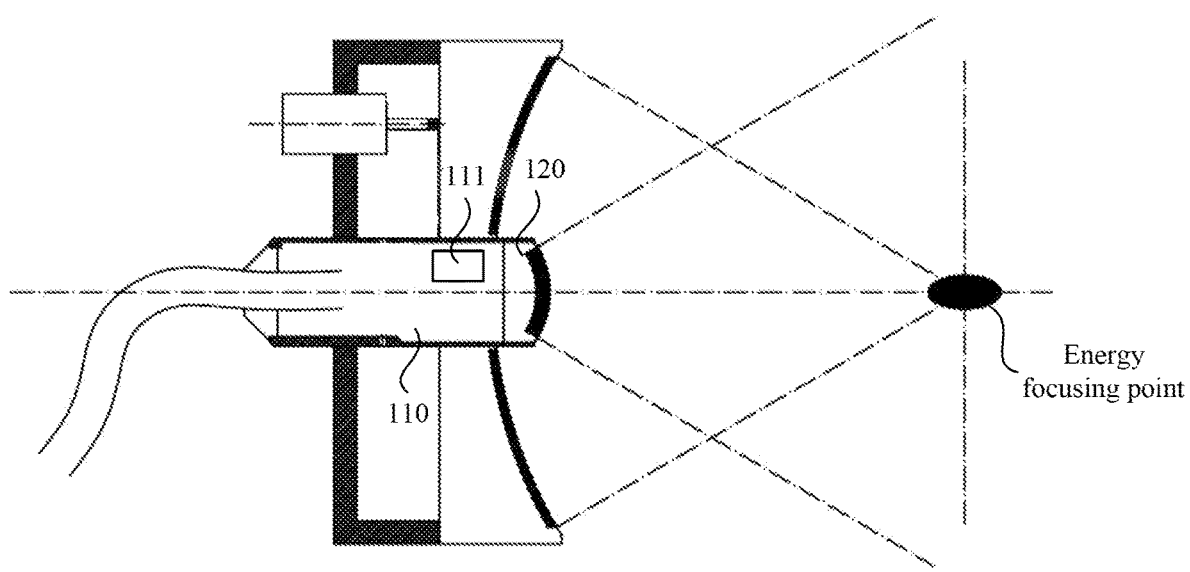
FIG. 8 is a schematic structural diagram of a high-intensity focused ultrasonic apparatus according to an embodiment of the present application.

As shown in FIG. 8, in an embodiment of the present application, the imaging device 100 includes a casing 110 and a front-end energy converter 120. A driving motor 111 is arranged in the casing 110. The casing 110 is fixedly connected to the high-intensity focused ultrasonic probe 340. The front-end energy converter 120 is driven by the driving motor 111 to rotate freely relative to the high-intensity focused ultrasonic probe 340.

This embodiment pertains to another embodiment in which the imaging device 100 is rotatably connected to the high-intensity focused ultrasonic probe 340. Specifically, in use, the driving motor 111 drives the front-end energy converter 120 to rotate, and the casing 110 keeps stationary. The front-end energy converter 120 is configured to acquire an image of the region to be treated.

In this embodiment, the casing 110, the front-end energy converter 120 and the driving motor 111 are provided, such that the front-end energy converter 120 is driven by the driving motor 111 to freely rotate relative to the high-intensity focused ultrasonic probe 340, thereby enabling the rotatable connection of the imaging device 100 to the high-intensity focused ultrasonic probe 340, and the rotation accuracy is high.

A control method for a high-intensity focused ultrasonic apparatus is further provided.

It is to be noted that the control method for a high-intensity focused ultrasonic apparatus according to the present application does not limit its execution subject. Optionally, an execution subject of the control method for a high-intensity focused ultrasonic apparatus according to the present application may be the high-intensity focused ultrasonic apparatus 10 mentioned in the foregoing content. Specifically, the high-intensity focused ultrasonic apparatus 10 may further include a control device. An execution subject of the control method of the high-intensity focused ultrasonic apparatus may be the control device.

Figure 9:
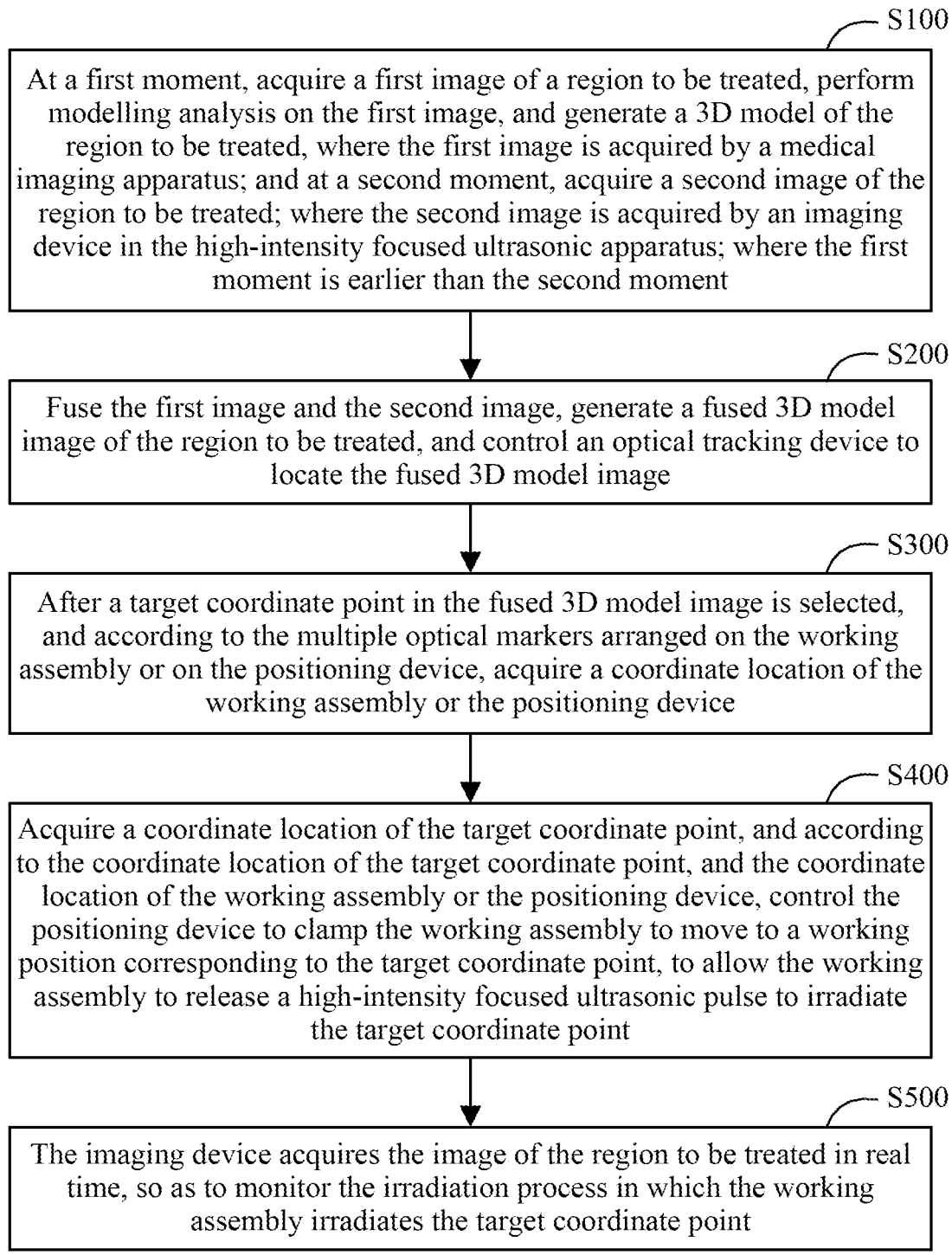
FIG. 9 is a schematic flowchart of a control method for a high-intensity focused ultrasonic apparatus according to an embodiment of the present application.

As shown in FIG. 9, in an embodiment of the present application, the control method for a high-intensity focused ultrasonic apparatus is applicable to the high-intensity focused ultrasonic apparatus 10 mentioned in the foregoing content. The control method for a high-intensity focused ultrasonic apparatus includes the following steps S100 to S500.

In S100, at a first moment, a first image of a region to be treated is acquired, modelling analysis is performed on the first image, and a 3D model of the region to be treated is generated. The first image is acquired by a medical imaging apparatus.

At a second moment, a second image of the region to be treated is acquired. The second image is acquired by the imaging device 100 in the high-intensity focused ultrasonic apparatus 10. The first moment is earlier than the second moment.

Specifically, the medical imaging apparatus may be one of an MRI apparatus (magnetic resonance imaging apparatus), a CT apparatus (electronic computed tomography apparatus), and an ultrasonic scanning apparatus. A time at which the medical imaging apparatus acquires the first image may be earlier than a time at which the imaging device 100 acquires the second image. The medical imaging apparatus acquires the first image first. The first image is an image of the region to be treated with higher definition than the second image. After the first image is acquired, modelling analysis can be performed on the first image, and a 3D model of the region to be treated can be generated.

Further, the imaging device 100 acquires the second image of the region to be treated. Since the region to be treated may change in real time, the second image is a real-time image of the region to be treated.

In S200, the first image and the second image are fused, and a fused 3D model image of the region to be treated is generated, and the optical tracking device is controlled to locate the fused 3D model image.

Specifically, the high-intensity focused ultrasonic apparatus 10 processes the first image and the second image, fuses the first image and the second image, and generates a fused 3D model image of the region to be treated. The optical tracking device 200 locates the fused 3D model image through the optical markers 220 placed on the surface of the region to be treated or the optical markers 200 on the imaging device 100.

In S300, after a target coordinate point in the fused 3D model image is selected, according to the multiple optical markers 220 arranged on the working assembly 300 or on the positioning device 400, a coordinate location of the working assembly 300 or a coordinate location of the positioning device 400 is acquired.

Specifically, the multiple optical markers 220 may be arranged on the working assembly 300. The multiple optical markers 220 may also be arranged on the positioning device 400. Multiple optical markers 220, regardless of multiple optical markers 220 arranged on the working assembly 300 or the positioning device 400, can realize locating of the working assembly 300.

In a case where the multiple optical markers 220 are arranged on the working assembly 300, the working assembly 300 can be located directly according to the locations of the multiple optical markers 220.

In a case where the multiple optical markers 220 are arranged on the positioning device 400, the working assembly 300 can be located according to the locations of the multiple optical markers 220 and the relative positional relationship between the positioning device 400 and the working assembly 300 (i.e., the distance between the positioning device 400 and the working assembly 300, which can be preset while the high-intensity focused ultrasonic apparatus 10 is being designed).

In S400, a coordinate location of the target coordinate point is acquired, and according to the coordinate location of the target coordinate point and the coordinate location of the working assembly 300 or the positioning device 400, the positioning device 400 is controlled to clamp the working assembly 300 and to move to a working position corresponding to the target coordinate point, to allow the working assembly 300 to release a high-intensity focused ultrasonic pulse to irradiate the target coordinate point.

Specifically, the high-intensity focused ultrasonic apparatus 10 may have a built-in control device. The control device can acquire the coordinate location of the target coordinate point, and control, according to the coordinate location of the target coordinate point and the coordinate location of the working assembly 300 or the positioning device 400, the positioning device 400 to clamp the working assembly 300 and to move to a working position corresponding to the target coordinate point, so that the working assembly 300 releases a high-intensity focused ultrasonic pulse to irradiate the target coordinate point.

In S500, the imaging device 100 acquires the image of the region to be treated in real time, so as to monitor the irradiation process in which the working assembly 300 irradiates the target coordinate point.

Specifically, after the working assembly 300 starts to release a high-intensity focused ultrasonic pulse to irradiate the target coordinate point, the imaging device 100 acquires an image of the region to be treated in real time. This is to monitor the irradiation process of the working assembly 300 irradiating the target coordinate point, so as to avoid irradiation errors or mis-operations of the working assembly 300.

In this embodiment, the positioning device 400 can clamp the working assembly 300, and quickly and accurately move to the working position corresponding to the target coordinate point, so that the working assembly 300 can quickly and accurately release a high-intensity focused ultrasonic pulse to the target coordinate point, which not only greatly improves the treatment accuracy but also improves the treatment efficiency of the high-intensity focused ultrasonic apparatus 10.

The technical features of the above-described embodiments can be combined arbitrarily. For the sake of brevity, not all possible combinations of the technical features in the above-described embodiments are described. However, as long as there is no contradiction in the combinations of these technical features, all the combinations should be regarded as within the scope described in this specification.

The above-described embodiments only represent several embodiments of the present application, and the descriptions thereof are relatively specific and detailed, but should not be construed as a limitation on the scope of the patent of the present application. It should be pointed out that for the person skilled in the art, on the premise of not departing from the concept of the present application, several modifications and improvements can be made, which all fall into the protection scope of the present application. Therefore, the scope of protection of the present application should be determined by the appended claims.

What is claimed is:

1. A high-intensity focused ultrasonic apparatus, configured to perform high-intensity focused ultrasonic treatment on a region to be treated, the high-intensity focused ultrasonic apparatus comprising:
    an imaging device, configured to acquire an image of the region to be treated;
    an optical tracking device, comprising a camera, and a plurality of optical markers arranged on the region to be treated or the imaging device for realizing locating of any point in the region to be treated;
    a working assembly, configured to release a high-intensity focused ultrasonic pulse to irradiate a target coordinate point after the target coordinate point in the region to be treated is selected; and
    a positioning device, wherein the positioning device has one end fixedly arranged, and another end configured to be capable of clamping the working assembly, and extending to move freely, and the positioning device is configured to clamp the working assembly to move to a working position corresponding to the target coordinate point to allow the working assembly to irradiate the target coordinate point;
    wherein a plurality of optical markers are further arranged on the working assembly or the positioning device for realizing locating of the working assembly;
    wherein an energy focusing point at which the working assembly releases a high-intensity focused ultrasonic pulse is located in an image scanning region of the imaging device;
    wherein the working assembly comprises a first component, a membrane, a second component, a high-intensity focused ultrasonic probe and a working assembly main body which are arranged to be stacked sequentially;

the first component is a hollow annular structure, and a plurality of first engaging members are provided on an outer circumference of the first component;

the second component is a hollow annular structure;

the membrane is arranged between the first component and the second component;

the high-intensity focused ultrasonic probe comprises a first end face and a second end face, and the second end face is fixedly/movably connected to the working assembly main body; and an outer wall of the working assembly main body is provided with second engaging members, and the second engaging members are arranged to be engageable with the plurality of first engaging members respectively; and wherein the working assembly main body comprises:

a base plate provided with a plurality of connecting holes;

a driving device, fixedly connected to a surface of the base plate;

a plurality of connecting rods, wherein each of the plurality of connecting rods has one end passing through a respective one of the plurality of connecting holes to be electrically connected to the driving device, and has another end fixedly/moveably connected to the second end face of the high-intensity focused ultrasonic probe; and a housing covering the base plate, the driving device and the plurality of connecting rods, wherein an outer surface of the housing is provided with the plurality of second engaging members.

2. The high-intensity focused ultrasonic apparatus according to claim 1, wherein the imaging device is an ultrasonic imaging probe.

3. The high-intensity focused ultrasonic apparatus according to claim 1, wherein the positioning device is a robotic arm.

4. The high-intensity focused ultrasonic apparatus according to claim 1, wherein the driving device is a driving motor.

5. The high-intensity focused ultrasonic apparatus according to claim 1, wherein each of the plurality of connecting rods comprises a first connecting rod and a second connecting rod that are rotatably connected to each other, wherein the first connecting rod is rotatable relative to the second connecting rod.

6. The high-intensity focused ultrasonic apparatus according to claim 5, wherein the driving device comprises a plurality of sub-driving devices, and a number of the plurality of sub-driving devices is less than or equal to a number of the plurality of connecting rods, each of the plurality of sub-driving devices is electrically connected to a respective one of the plurality of connecting rod.

7. The high-intensity focused ultrasonic apparatus according to claim 1, wherein the working assembly further comprises:

a slider, arranged on the outer surface of the housing, wherein one end of the positioning device is slidably connected to the working assembly main body through the slider, to allow the working assembly to freely slide relative to the positioning device when the positioning device clamps the working assembly; and a medium injection hole, provided on the outer surface of the housing.

8. The high-intensity focused ultrasonic apparatus according to claim 1, wherein the imaging device is integrally formed with the working assembly.

9. The high-intensity focused ultrasonic apparatus according to claim 8, wherein the high-intensity focused ultrasonic probe is provided with a through hole, and the imaging device passes through the through hole to be connected to the high-intensity focused ultrasonic probe.

10. The high-intensity focused ultrasonic apparatus according to claim 9, wherein the working assembly further comprises:

a first gear, sleeved on a driving shaft of the driving device; and a second gear, sleeved on the imaging device;

wherein the first gear meshes with the second gear.

11. The high-intensity focused ultrasonic apparatus according to claim 9, wherein the imaging device comprises a casing and a front-end energy converter, wherein a driving motor is arranged in the casing, the casing is fixedly connected to the high-intensity focused ultrasonic probe, and the front-end energy converter is driven by the driving motor to rotate freely relative to the high-intensity focused ultrasonic probe.

12. A control method for a high-intensity focused ultrasonic apparatus, applicable to a high-intensity focused ultrasonic apparatus, wherein the high-intensity focused ultrasonic apparatus is configured to perform high-intensity focused ultrasonic treatment on a region to be treated, and the high-intensity focused ultrasonic apparatus comprises:

an imaging device, configured to acquire an image of the region to be treated;

an optical tracking device, comprising a camera, and a plurality of optical markers arranged on the region to be treated or the imaging device for realizing locating of any point in the region to be treated;

a working assembly, configured to release a high-intensity focused ultrasonic pulse to irradiate a target coordinate point after the target coordinate point in the region to be treated is selected; and a positioning device, wherein the positioning device has one end fixedly arranged, and another end configured to be capable of clamping the working assembly, and extending to move freely, and the positioning device is configured to clamp the working assembly to move to a working position corresponding to the target coordinate point to allow the working assembly to irradiate the target coordinate point;

wherein a plurality of optical markers are further arranged on the working assembly or the positioning device for realizing locating of the working assembly;

wherein an energy focusing point at which the working assembly releases a high-intensity focused ultrasonic pulse is located in an image scanning region of the imaging device;

wherein the working assembly comprises a first component, a membrane, a second component, a high-intensity focused ultrasonic probe and a working assembly main body which are arranged to be stacked sequentially;

the first component is a hollow annular structure, and a plurality of first engaging members are provided on an outer circumference of the first component;

the second component is a hollow annular structure;

the membrane is arranged between the first component and the second component;

the high-intensity focused ultrasonic probe comprises a first end face and a second end face, and the second end face is fixedly/movably connected to the working assembly main body; and an outer wall of the working assembly main body is provided with second engaging members, and the second engaging members are arranged to be engageable with the plurality of first engaging members respectively; and wherein the working assembly main body comprises:

a base plate provided with a plurality of connecting holes;

a driving device, fixedly connected to a surface of the base plate;

a plurality of connecting rods, wherein each of the plurality of connecting rods has one end passing through a respective one of the plurality of connecting holes to be electrically connected to the driving device, and has another end fixedly/moveably connected to the second end face of the high-intensity focused ultrasonic probe; and a housing covering the base plate, the driving device and the plurality of connecting rods, wherein an outer surface of the housing is provided with the plurality of second engaging members;

wherein the control method for a high-intensity focused ultrasonic apparatus comprises:

at a first moment, acquiring a first image of a region to be treated, performing modelling analysis on the first image, and generating a 3D model of the region to be treated; wherein the first image is acquired by a medical imaging apparatus;

at a second moment, acquiring a second image of the region to be treated; wherein the second image is acquired by an imaging device in the high-intensity focused ultrasonic apparatus; wherein the first moment is earlier than the second moment;

fusing the first image and the second image, generating a fused 3D model image of the region to be treated, and controlling an optical tracking device to locate the fused 3D model image;

after a target coordinate point in the fused 3D model image is selected, and according to a plurality of optical markers arranged on a working assembly or on a positioning device, acquiring a coordinate location of the working assembly or a coordinate location of the positioning device;

acquiring a coordinate location of the target coordinate point, and according to the coordinate location of the target coordinate point, and the coordinate location of the working assembly or the coordinate location of the positioning device, controlling the positioning device to clamp the working assembly to move to a working position corresponding to the target coordinate point, to allow the working assembly to release a high-intensity focused ultrasonic pulse to irradiate the target coordinate point; and acquiring, by the imaging device, images of the region to be treated in real time, to monitor an irradiation process in which the working assembly irradiates the target coordinate point.

13. The control method for the high-intensity focused ultrasonic apparatus according to claim 12, wherein the imaging device is an ultrasonic imaging probe.

14. The control method for the high-intensity focused ultrasonic apparatus according to claim 12, wherein the positioning device is a robotic arm.

15. The control method for the high-intensity focused ultrasonic apparatus according to claim 12, wherein the driving device is a driving motor.

16. The control method for the high-intensity focused ultrasonic apparatus according to claim 12, wherein each of the plurality of connecting rods comprises a first connecting rod and a second connecting rod that are rotatably connected to each other, wherein the first connecting rod is rotatable relative to the second connecting rod.

17. The control method for the high-intensity focused ultrasonic apparatus according to claim 16, wherein the driving device comprises a plurality of sub-driving devices, and a number of the plurality of sub-driving devices is less than or equal to a number of the plurality of connecting rods, each of the plurality of sub-driving devices is electrically connected to a respective one of the plurality of connecting rod.

18. The control method for the high-intensity focused ultrasonic apparatus according to claim 12, wherein the working assembly further comprises:

a slider, arranged on the outer surface of the housing, wherein one end of the positioning device is slidably connected to the working assembly main body through the slider, to allow the working assembly to freely slide relative to the positioning device when the positioning device clamps the working assembly; and a medium injection hole, provided on the outer surface of the housing.

19. The control method for the high-intensity focused ultrasonic apparatus according to claim 12, wherein the imaging device is integrally formed with the working assembly.

20. The control method for the high-intensity focused ultrasonic apparatus according to claim 19, wherein the high-intensity focused ultrasonic probe is provided with a through hole, and the imaging device passes through the through hole to be connected to the high-intensity focused ultrasonic probe.

* * * * *